United States Patent
Matsukawa et al.

(10) Patent No.: US 12,283,509 B2
(45) Date of Patent: Apr. 22, 2025

(54) LOAD PORT ADAPTER

(71) Applicant: NIDEC READ CORPORATION, Kyoto (JP)

(72) Inventors: Toshihide Matsukawa, Kyoto (JP); Takashi Isa, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 240 days.

(21) Appl. No.: 17/912,058

(22) PCT Filed: Mar. 11, 2021

(86) PCT No.: PCT/JP2021/009932
§ 371 (c)(1),
(2) Date: Sep. 16, 2022

(87) PCT Pub. No.: WO2021/187340
PCT Pub. Date: Sep. 23, 2021

(65) Prior Publication Data
US 2023/0163008 A1 May 25, 2023

(30) Foreign Application Priority Data
Mar. 17, 2020 (JP) ................. 2020-046405

(51) Int. Cl.
*H01L 21/677* (2006.01)
*H01L 21/673* (2006.01)
*H01L 21/68* (2006.01)

(52) U.S. Cl.
CPC .... *H01L 21/67772* (2013.01); *H01L 21/6732* (2013.01); *H01L 21/6734* (2013.01); *H01L 21/68* (2013.01)

(58) Field of Classification Search
CPC ......... H01L 21/67775; H01L 21/67772; H01L 21/6734; H01L 21/6732; H01L 21/68
See application file for complete search history.

(56) References Cited

U.S. PATENT DOCUMENTS

| | | |
|---|---|---|
| 7,275,905 B2 | 10/2007 | Lee |
| 2005/0173358 A1 | 8/2005 | Oyama |
| 2011/0303125 A1 | 12/2011 | Itou et al. |
| 2014/0325772 A1* | 11/2014 | Jhon ................ H01L 21/67028 15/97.1 |

(Continued)

FOREIGN PATENT DOCUMENTS

| | | | |
|---|---|---|---|
| JP | H04179252 A | 6/1992 | |
| JP | H10144755 A | 5/1998 | |

(Continued)

*Primary Examiner* — Glenn F Myers
(74) *Attorney, Agent, or Firm* — Viering, Jentschura & Partner mbB; Robert Bilotta, Jr.

(57) ABSTRACT

A load port adapter is a load port adapter fixable on a mounting table of a load port. The load port adapter includes a holder capable of holding a cassette capable of accommodating a plurality of circuit boards. The holder is fixable on the mounting table of the load port. The holder includes a position adjustment mechanism configured to position the cassette at a reference position. In the cassette clamped on the load port adapter, the reference position is a reference position on a load port adapter side when the circuit board is taken out from the cassette.

8 Claims, 5 Drawing Sheets

(56) References Cited

U.S. PATENT DOCUMENTS

2017/0170043 A1\* 6/2017 Oh .................... H01L 21/67017
2019/0035660 A1\* 1/2019 Lin .................... H01L 21/67393

FOREIGN PATENT DOCUMENTS

| JP | 2003142551 A | 5/2003 |
|----|--------------|--------|
| JP | 2012064827 A | 3/2012 |
| JP | 5211808 B2 | 6/2013 |

\* cited by examiner

LOAD PORT ADAPTER

CROSS-REFERENCE TO RELATED APPLICATIONS

This is a U.S. National Stage Application of International Application No. PCT/JP2021/009932, filed on Mar. 11, 2021, and claims priority under 35 U.S.C. § 119(a) and 35 U.S.C. § 365(b) from Japanese Patent Application No. 2020-046405, filed on Mar. 17, 2020; the disclosures of which are incorporated herein by reference.

FIELD

Various embodiments of the present disclosure relate] to a load port adapter.

BACKGROUND

A load port is known as an apparatus for opening and closing a lid of a substrate storage container storing a substrate. There is known a load port including a stage on which a Front Opening Unified Pod (FOUP) serving as a substrate storage container can be mounted, a clamping means capable of clamping a bottom surface of the FOUP, a suction means that sucks and holds a lid of the FOUP, and a door that opens and closes the lid held by the suction means.

In the load port, an open cassette can be mounted in addition to the FOUP. Additionally, the load port determines which one of the FOUP and the open cassette is mounted, based on determination as to whether the suction means completes a suction operation at the same time with performing the suction operation.

Incidentally, the configuration, dimensions, and the like of the load port as described above are determined according to standards. Additionally, the configuration, dimensions, and the like of the FOUP to be mounted on the load port are also determined according to standards. Therefore, unless a storage container has the same configuration and dimensions as those of the FOUP, the storage container cannot be mounted on the load port in a stable and positioned state.

On the other hand, even a storage container having a configuration, dimensions, and the like different from those of the FOUP is required to be mounted on the load port in a stable and positioned state.

SUMMARY

A load port adapter according to an embodiment of the present disclosure is a load port adapter fixable on a mounting table of a load port. The load port adapter includes a holder capable of holding a cassette capable of accommodating a plurality of circuit boards. The holder includes a position adjustment mechanism configured to position the cassette at a reference position, and is fixable on the mounting table of the load port.

The above and other elements, features, steps, characteristics and advantages of the present disclosure will become more apparent from the following detailed description of the preferred embodiments with reference to the attached drawings.

DETAILED DESCRIPTION

At least one embodiment of the present disclosure will be described below in detail with reference to the drawings. Note that, the same or corresponding parts in the drawings are denoted by the same reference numerals, and the description thereof will not be repeated. Additionally, the dimensions of constituent members in each drawing do not faithfully represent the actual dimensions of the constituent members, the dimensional ratio of each constituent member, or the like.

Note that, in the following description, a vertical direction in a state where a load port 100 is installed is referred to as an "up and down direction".

Figure 1:
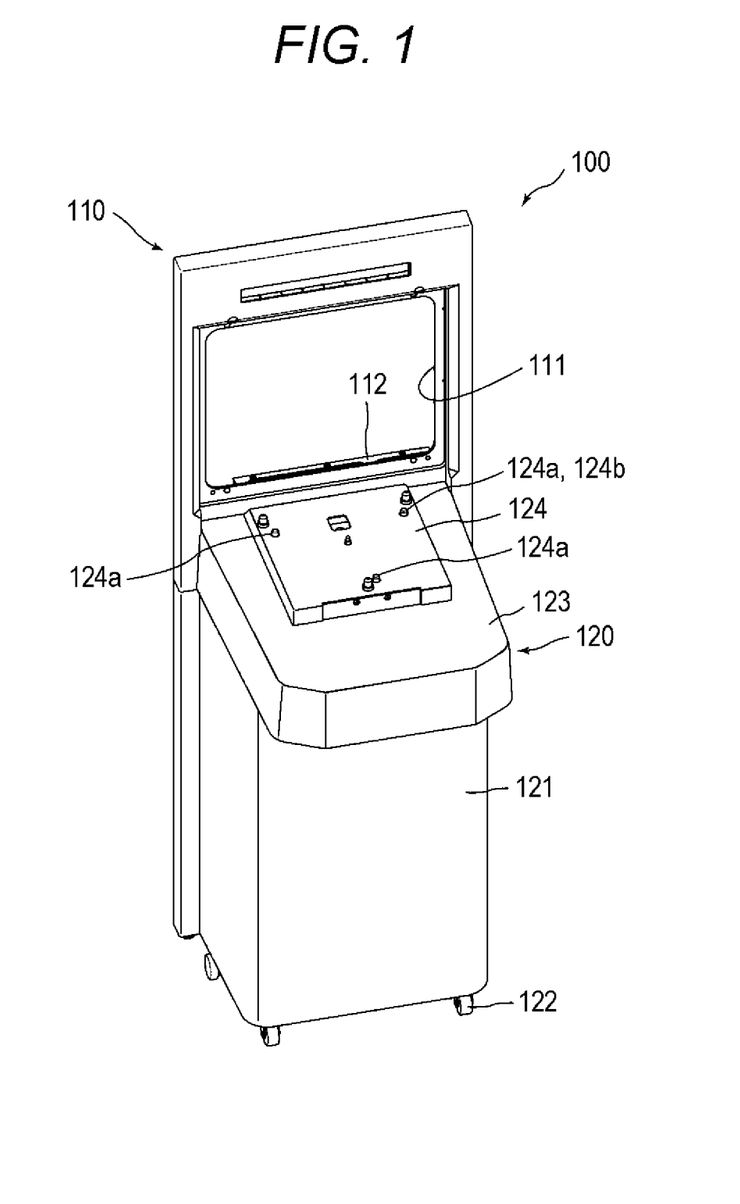
FIG. 1 is a perspective view illustrating a schematic configuration of a load port according to an embodiment.

FIG. 1 is a perspective view illustrating a schematic configuration of the load port 100 to which a load port adapter according to an embodiment of the present disclosure is to be attached. The load port 100 is a table on which a cassette accommodating a circuit board that is an inspection object and is made of resin is to be mounted when the circuit board is supplied to an inspection apparatus (not illustrated).

Note that, a cassette 200 is a storage container having a configuration, dimensions, and the like different from those of a Front Opening Unified Pod (FOUP) whose configuration, dimensions, and the like are determined according to standards.

The load port 100 includes a supply part 110 and a support 120. The supply part 110 is a part that supplies a circuit board to the inspection apparatus. The support 120 supports a cassette accommodating the circuit board when the circuit board is supplied from the supply part 110 to the inspection apparatus. The supply part 110 is supported by the support 120.

The support 120 includes a support body 121, a plurality of wheels 122, a support base 123, and a mounting table 124. The support body 121 is a columnar member extending in the up and down direction. The support body 121 supports the support base 123 and the mounting table 124. The plurality of wheels 122 are attached to a lower end of the support body 121. The support base 123 is fixed to an upper end of the support body 121. The mounting table 124 is fixed on the support base 123.

Figure 2:
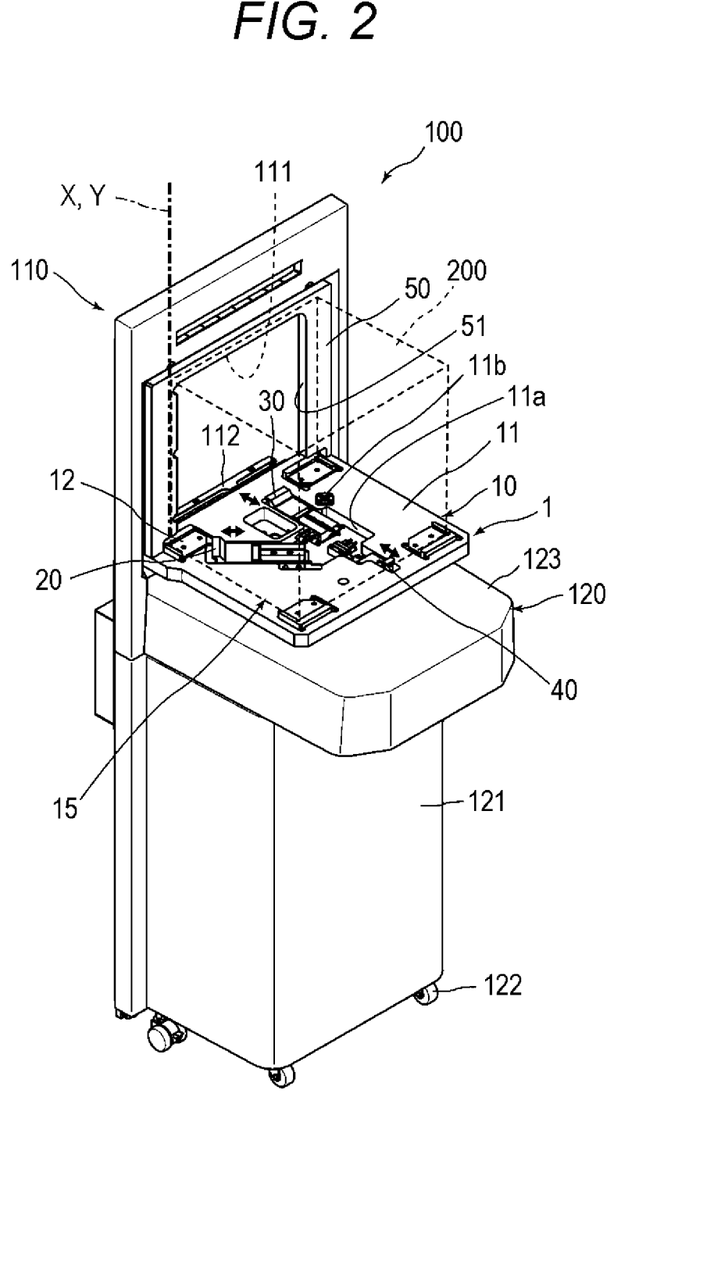
FIG. 2 is a perspective view illustrating a state where a load port adapter is attached to the load port.

FIG. 2 is a perspective view illustrating a state where a load port adapter 1 to be described later is fixed on the mounting table 124. The load port adapter 1 allows the cassette 200 to be clamped to the mounting table 124. That is, the cassette 200 is clamped on the mounting table 124 of the load port 100 through the load port adapter 1. Note that, a detailed configuration of the cassette 200 will be described later. Here, FIG. 2 illustrates, for the sake of explanation, the load port adapter 1 with a cover 60 removed.

As illustrated in FIG. 1, the mounting table 124 includes a plurality of detection sensors 124a. The plurality of detection sensors 124a are sensors for detecting whether the FOUP is mounted on the mounting table 124. When the cassette 200 is clamped on the mounting table 124 through the load port adapter 1 as in the present embodiment, only one of the plurality of detection sensors 124a is used as a cassette detection sensor that detects whether the cassette 200 is located on the load port adapter 1.

Each of the plurality of detection sensors 124a is a displacement detection sensor that outputs a detection signal when a force is applied from above and a detection unit is displaced downward. In the present embodiment, the plurality of detection sensors 124a are three detection sensors. When the mounting table 124 is viewed from above, the three detection sensors 124a are disposed in a triangular shape.

As will be described in detail later, as illustrated in FIG. 2, the load port adapter 1 includes an advancing and retracting pin 11b that comes into contact with one detection sensor 124b of the plurality of detection sensors 124a. The one detection sensor 124b functions as the cassette detection sensor together with the advancing and retracting pin 11b. Note that, the remaining detection sensors are positioned inside the load port adapter 1 and are not exposed to the outside of the load port adapter 1. The load port adapter 1 may include two or more advancing and retracting pins 11b that come into contact with the detection sensor 124b.

As illustrated in FIG. 1, the supply part 110 is a plate-shaped member and has a supply opening 111. That is, the supply part 110 has a frame shape. Additionally, the supply part 110 includes a lid 112 that opens and closes the supply opening 111. The lid 112 is movable with respect to the supply opening 111.

When the detection sensor 124b of the mounting table 124 detects a state where the cassette 200 is mounted on the mounting table 124, the lid 112 moves from a position where the supply opening 111 is closed to a position where the supply opening 111 is open. That is, the lid 112 opens the supply opening 111 of the supply part 110 when the circuit board accommodated in the cassette 200 is supplied to the inspection apparatus.

Figure 3:
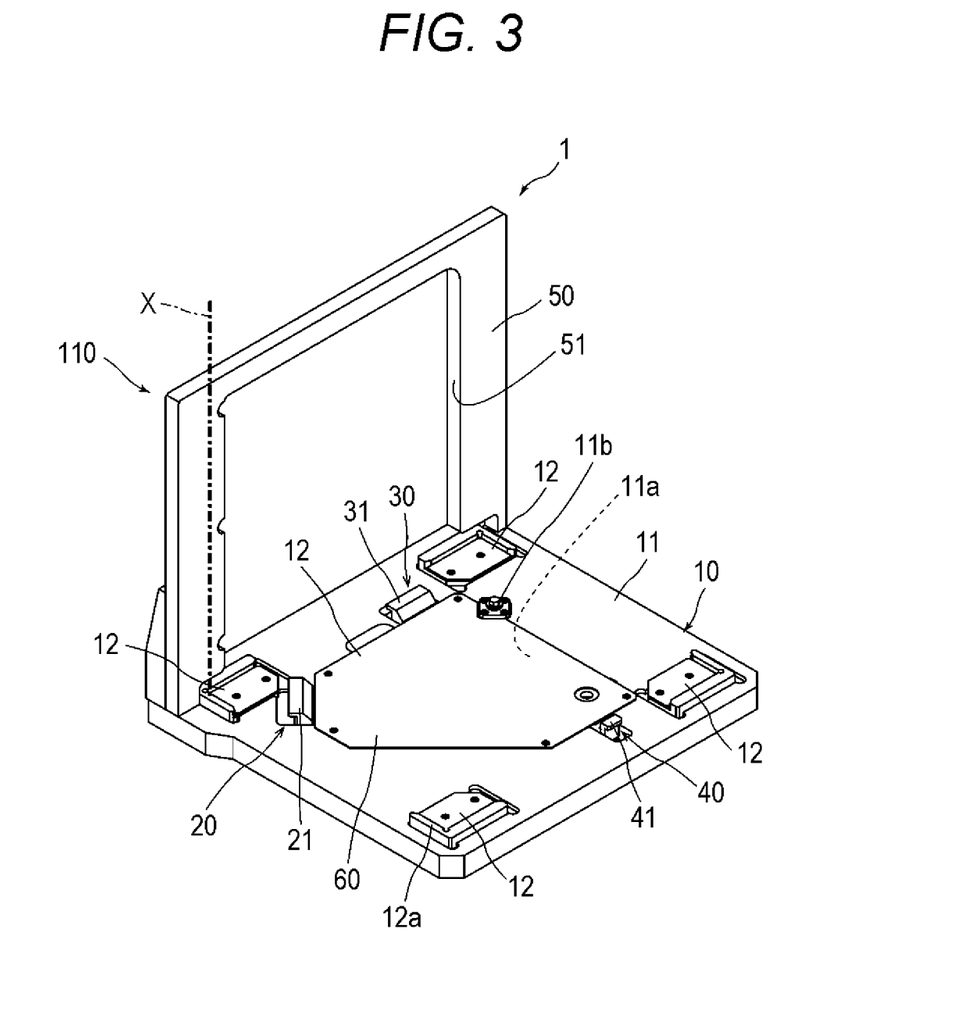
FIG. 3 is a perspective view illustrating a schematic configuration of the load port adapter.
Figure 4:
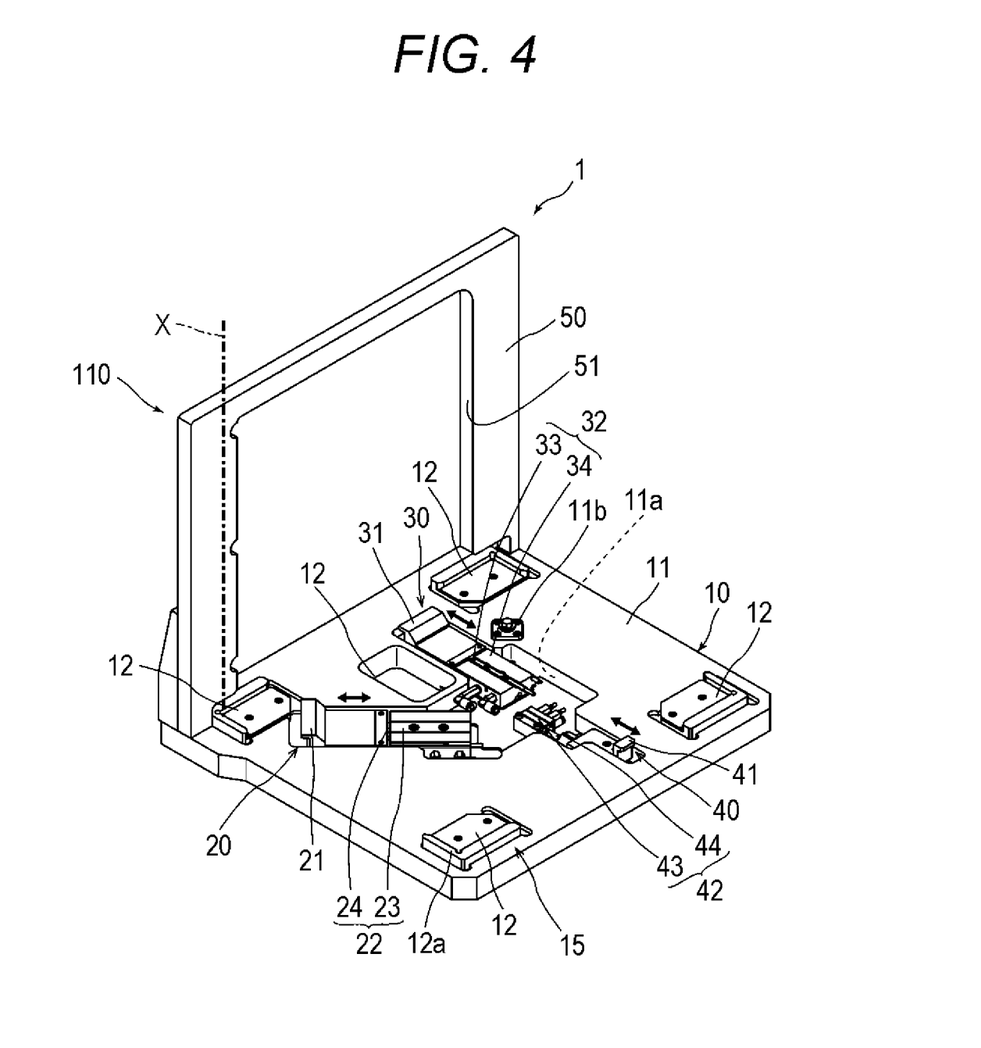
FIG. 4 is a perspective view illustrating a state where a cover of the load port adapter is removed.

FIGS. 3 and 4 are perspective views each illustrating a schematic configuration of the load port adapter 1. FIG. 4 is a perspective view illustrating a state where the cover 60 of the load port adapter 1 is removed. The load port adapter 1 includes a holder 10 and a frame 50.

The holder 10 has a flat plate shape and holds the cassette 200. The frame 50 is a frame-shaped member extending in a direction orthogonal to the holder 10. The frame 50 covers a part of the supply part 110. The frame 50 has an opening 51 connected to the supply opening 111 in a state of covering the supply part 110.

As illustrated in FIG. 2, in a state where the cassette 200 is clamped to the load port adapter 1 fixed to the load port 100, the frame 50 covers a gap between the supply opening 111 of the load port 100 connected to an opening 200b (described later) of the cassette 200 and an outer periphery of the cassette 200 on an opening 200b side. This can prevent an operator from inserting his or her hand, finger, or the like into the gap between the supply opening 111 of the load port 100 and the cassette 200. Thus, when the cassette 200 is used for the load port 100, safety can be improved.

As illustrated in FIGS. 3 and 4, the holder 10 includes a holder body 11, a plurality of cassette positioning parts 12, and a plurality of cassette clamping parts 20, 30, and 40. The position of the cassette 200 with respect to the load port adapter 1 is adjusted by the plurality of cassette positioning parts 12 and the plurality of cassette clamping parts 20, 30, and 40. That is, the plurality of cassette positioning parts 12 and the plurality of cassette clamping parts 20, 30, and 40 can constitute a position adjustment mechanism 15 in embodiments of the present disclosure.

The holder body 11 is a flat plate-shaped member. The plurality of cassette positioning parts 12 are fixed to the holder body 11. Additionally, the holder body 11 has an accommodating recess 11a that accommodates the plurality of cassette clamping parts 20, 30, and 40. The accommodating recess 11a is covered with the cover 60.

The holder body 11 includes the advancing and retracting pin 11b with which the detection sensor 124b of the load port 100 comes into contact, in a state where the load port adapter 1 is fixed on the mounting table 124 of the load port 100. A lower portion of the advancing and retracting pin 11b is located in a through hole (not illustrated) of the holder body 11. In the state where the load port adapter 1 is fixed on the mounting table 124 of the load port 100, a distal end of the detection sensor 124b of the load port 100 is located in the through hole. The advancing and retracting pin 11b whose lower portion is located in the through hole can advance and retract in a thickness direction with respect to the holder body 11.

When the load port adapter 1 is set on the mounting table 124 of the load port 100, the detection sensor 124b of the load port 100 pushes the advancing and retracting pin 11b upward. When the cassette 200 is set on the load port adapter 1, the cassette 200 pushes the detection sensor 124b downward through the advancing and retracting pin 11b. Thus, seating of the cassette 200 can be detected.

The plurality of cassette positioning parts 12 position a bottom of the cassette 200 to be described later with respect to the holder body 11. That is, each of the plurality of cassette positioning parts 12 includes an L-shaped protruding portion 12a when the holder body 11 is viewed from above. The protruding portions 12a of the plurality of cassette positioning parts 12 come into contact with outer portions of corners of the bottom of the cassette 200, thus positioning the cassette 200 with respect to the holder body 11.

Here, in the present embodiment, the plurality of cassette positioning parts 12 are four cassette positioning parts. The four cassette positioning parts 12 position the bottom of the cassette 200 to be described later with respect to the holder body 11.

The plurality of cassette clamping parts include a first cassette clamping part 20, a second cassette clamping part 30, and a third cassette clamping part 40.

The first cassette clamping part 20 presses the cassette 200 mounted on the load port adapter 1 against a reference position X. The reference position X is a position of one of two corners located on a frame 50 side of the holder body 11. In the cassette 200 clamped on the load port adapter 1, the reference position X is a reference position on a load port adapter 1 side when the circuit board is taken out from the cassette 200.

As will be described in detail later, the reference position X is a position where a corner located on an opening side among the four corners of the cassette 200 is located on the load port adapter 1 in a state where the cassette 200 is clamped to the load port adapter 1.

When the load port adapter 1 is viewed from above, the first cassette clamping part 20 obliquely pushes the cassette 200 from a central portion of the holder body 11 toward the reference position X.

The first cassette clamping part 20 includes a contact part 21 and a drive part 22. The contact part 21 comes into contact with a protrusion (not illustrated) located at the bottom of the cassette 200. As indicated by solid double arrows in FIGS. 2 and 4, the drive part 22 reciprocates the contact part 21 in one direction. That is, when the load port adapter 1 is viewed from above, the drive part 22 moves the contact part 21 from the central portion of the holder body 11 toward the reference position X.

Specifically, the drive part 22 includes an actuator 23 and a coupling shaft 24. A distal end of the coupling shaft 24 is connected to the contact part 21. The actuator 23 is, for example, a cylinder mechanism or the like that moves the coupling shaft 24 in an axial direction.

The second cassette clamping part 30 presses the cassette 200 mounted on the load port adapter 1 against the frame 50. Similarly to the first cassette clamping part 20, the second cassette clamping part 30 also includes a contact part 31 and a drive part 32.

The contact part 31 comes into contact with a protrusion (not illustrated) located at the bottom of the cassette 200. As indicated by solid double arrows in FIGS. 2 and 4, the drive part 32 reciprocates the contact part 31 in a direction different from the direction in which the contact part 21 of the first cassette clamping part 20 moves. That is, when the load port adapter 1 is viewed from above, the drive part 32 moves the contact part 31 from the central portion of the holder body 11 toward the frame 50.

Specifically, the drive part 32 includes an actuator 33 and a coupling shaft 34. A distal end of the coupling shaft 34 is connected to the contact part 31. The actuator 33 is, for example, a cylinder mechanism or the like that moves the coupling shaft 34 in the axial direction.

The third cassette clamping part 40 clamps the cassette 200 mounted on the load port adapter 1 to the load port adapter 1 together with the first cassette clamping part 20 and the second cassette clamping part 30. When the load port adapter 1 is viewed from above, the third cassette clamping part 40 pushes the cassette 200 in a direction opposite to the second cassette clamping part 30. That is, the third cassette clamping part 40 pushes the cassette 200 in a direction different from the direction toward the reference position X.

Similarly to the first cassette clamping part 20 and the second cassette clamping part 30, the third cassette clamping part 40 also includes a contact part 41 and a drive part 42. The contact part 41 comes into contact with a protrusion (not illustrated) located at the bottom of the cassette 200. As indicated by solid double arrows in FIGS. 2 and 4, the drive part 42 reciprocates the contact part 41 in a direction different from the directions in which the contact part 21 of the first cassette clamping part 20 and the contact part 31 of the second cassette clamping part 30 move. That is, when the load port adapter 1 is viewed from above, the drive part 42 moves the contact part 41 from the central portion of the holder body 11 toward the side opposite to the frame 50.

Specifically, the drive part 42 includes an actuator 43 and a coupling shaft 44. A distal end of the coupling shaft 44 is connected to the contact part 41. The actuator 43 is, for example, a cylinder mechanism or the like that moves the coupling shaft 44 in the axial direction.

The force with which the first cassette clamping part 20 and the second cassette clamping part 20 push the cassette 200 toward the reference position X is larger than the force with which the third cassette clamping part 40 pushes the cassette 200 in a direction different from the reference position X.

Here, the plurality of cassette clamping parts 20, 30, and 40 of the load port adapter 1 are driven and controlled by a controller (not illustrated). Additionally, the controller receives a signal output from the detection sensor 124b. The controller may control driving of the plurality of cassette clamping parts 20, 30, and 40 based on the signal, or may control opening and closing of the lid 112 of the load port 100.

Figure 5:
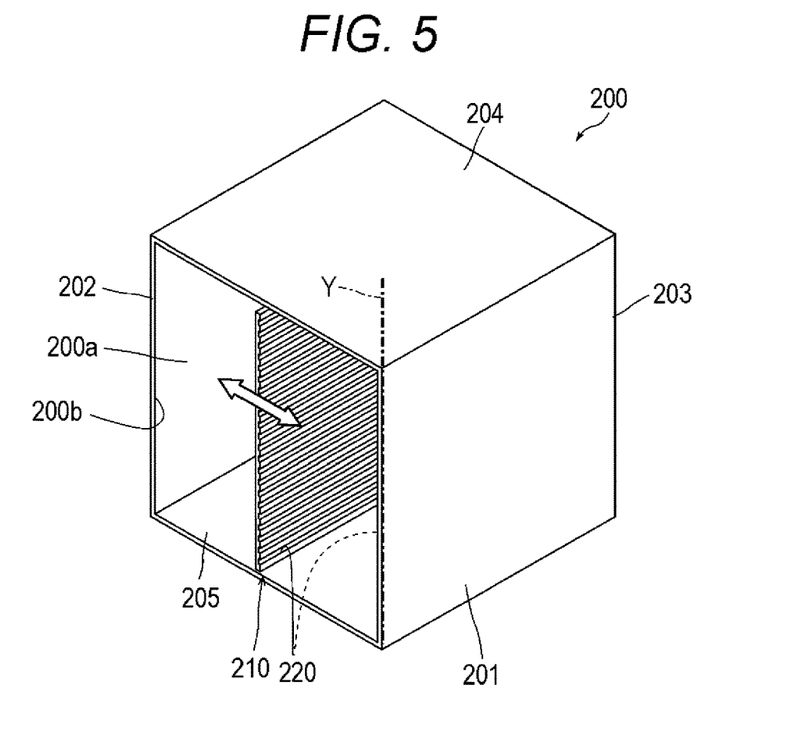
FIG. 5 is a perspective view illustrating a schematic configuration of a cassette.

FIG. 5 is a perspective view illustrating a schematic configuration of the cassette 200. The cassette 200 is a cubic box-shaped member. That is, the cassette 200 has a space 200a surrounded by a plurality of flat plate-shaped walls 201 to 205. The cassette 200 can accommodate a plurality of circuit boards arranged in the thickness direction. The cassette 200 has the opening 200b in one surface thereof. The opening 200b is located on an opening 51 side of the frame 50 in a state where the cassette 200 is clamped on the load port adapter 1.

The cassette 200 includes a movable wall 210 that moves laterally in the internal space 200a in a state of being parallel to the lateral wall 201 constituting the cassette 200. A moving direction of the movable wall 210 is indicated by a white double arrow in FIG. 5.

The movable wall 210 and the lateral wall 201 facing the movable wall 210 each have a plurality of slits 220 on their facing surfaces. The plurality of slits 220 extend from an opening 200b side toward the wall 203 on a side opposite to the opening 200b. This allows the plurality of slits 220 of the movable wall 210 and the plurality of slits 220 of the lateral wall 201 facing the movable wall 210 to hold the plurality of circuit boards in a state of being arranged in the thickness direction.

In the cassette 200 having such a configuration, by moving the movable wall 210 laterally with respect to the lateral wall 201 facing the movable wall 210, even when the size of the circuit board is changed, the circuit board can be held, in the state of being arranged in the thickness direction, by the plurality of slits 220 of the movable wall 210 and the plurality of slits 220 of the lateral wall 201 facing the movable wall 210.

In the state where the cassette 200 is clamped on the load port adapter 1, among the walls 201 to 205 defining the opening 200b of the cassette 200, the lateral wall 201 having the plurality of slits 220 is positioned at the reference position X. In the lateral wall 201 having the plurality of slits 220, a portion defining the opening 200b is a reference position Y on a cassette 200 side. The reference position Y overlaps with the reference position X on the load port adapter 1 side in a state where the cassette 200 is clamped on the load port adapter 1 as illustrated in FIG. 2.

Note that, the reference positions X and Y are used as a starting point of a conveyance position, for example, when a conveyance device such as a robot arm conveys the circuit board from the cassette 200 clamped on the load port adapter 1 to an inspection apparatus (not illustrated).

Figure 6:
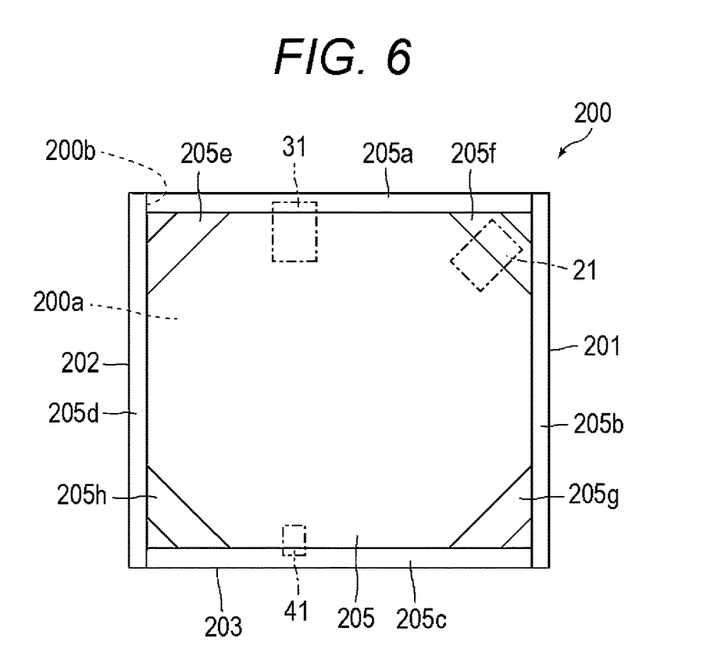
FIG. 6 is a bottom view of the cassette.

FIG. 6 is a bottom view of the cassette 200. In FIG. 6, alternate long and short dash lines indicate contact positions of the contact part 21 of the first cassette clamping part 20, the contact part 31 of the second cassette clamping part 30, and the contact part 41 of the third cassette clamping part 40 with respect to the cassette 200.

The cassette 200 includes plate-shaped attachment parts 205a to 205d respectively on four sides of the wall 205 located on the bottom surface thereof. The attachment parts 205a to 205d are fixed in a state of being separated from the wall 203 in the thickness direction. The cassette 200 further includes diagonal braces 205e to 205h at four corners of the wall 205. The diagonal braces 205e to 205h each connect the attachment parts 205a located on adjacent sides of the four sides.

When the cassette 200 is clamped on the load port adapter 1, the contact part 21 of the first cassette clamping part 20, the contact part 31 of the second cassette clamping part 30, and the contact part 41 of the third cassette clamping part 40 come into contact with the cassette 200 at the following respective positions.

The contact part 21 of the first cassette clamping part 20 is inserted between the wall 205 and the diagonal brace 205f located on the opening 200b side of the cassette 200. Thus, the first cassette clamping part 20 comes into contact with the diagonal brace 205f of the cassette 200 to clamp the cassette 200.

The contact part 31 of the second cassette clamping part 30 is inserted between the wall 205 and the attachment part 205a located on the opening 200b side of the cassette 200. Thus, the second cassette clamping part 30 comes into contact with the attachment part 205a of the cassette 200 to clamp the cassette 200.

The contact part 41 of the third cassette clamping part 40 is inserted between the wall 205 and the attachment part 205c located on the side opposite to the opening 200b of the cassette 200. Thus, the third cassette clamping part 40 comes into contact with the attachment part 205c of the cassette 200 to clamp the cassette 200.

As described above, the load port adapter 1 of the present embodiment is a load port adapter fixable on the mounting table 124 of the load port 100. The load port adapter 1 includes the holder 10 capable of holding the cassette 200 capable of accommodating a plurality of circuit boards. The holder 10 includes the position adjustment mechanism 15 configured to position the cassette 200 at the reference position X. The holder 10 is fixable on the mounting table 124 of the load port 100.

This allows the cassette 200 capable of accommodating the circuit board to be set on the mounting table of the load port 100. Thus, versatility of the load port 100 can be improved.

Generally, the cassette can accommodate circuit boards of various sizes. Consequently, the cassette has a predetermined reference position serving as reference when the circuit board is taken out from the cassette. Positioning the reference position of the cassette at the reference position of the adapter can determine the position of the cassette with respect to the load port to which the adapter is fixed.

As described above, since the holder 10 includes the position adjustment mechanism 15, the cassette 200 can be positioned at the reference position X of the load port adapter 1. Thus, the cassette 200 can be easily positioned with respect to the load port 100 to which the load port adapter 1 is attached. Consequently, the cassette 200 can be mounted on the load port 100 in a stable and positioned state.

The position adjustment mechanism 15 includes a plurality of cassette clamping parts 20, 30, and 40 that clamp the cassette 200 while pressing the cassette 200 toward the reference position X.

This allows the cassette 200 to be clamped to the load port adapter 1 in a state of being positioned at the reference position X of the load port adapter 1.

The plurality of cassette clamping parts 20, 30, and 40 press the cassette 200 in different directions when the holder 10 is viewed in plan view.

This allows the cassette 200 to be pressed in different directions when the holder 10 is viewed in plan view. Thus, the cassette 200 can be more reliably held with respect to the holder 10.

The plurality of cassette clamping parts 10, 20, and 30 include the first cassette clamping part 20 and the second cassette clamping part 30 that push the cassette 200 toward the reference position X and the third cassette clamping part 40 that pushes the cassette 200 in a direction different from the direction toward the reference position X when the holder 10 is viewed in plan view. The force with which the first cassette clamping part 20 and the second cassette clamping part 30 push the cassette 200 toward the reference position X is larger than the force with which the third cassette clamping part 40 pushes the cassette 200 in the direction different from the direction toward the reference position X.

Among the forces acting on the cassette 200, which are caused by the plurality of cassette clamping parts 10, 20, and 30, the force positioning the cassette 200 at the reference position X is larger, so that the cassette 200 can be more reliably positioned at the reference position X. Thus, the cassette 200 can be more accurately positioned with respect to the load port adapter 1.

The cassette clamping parts 20, 30, and 40 include contact parts 21, 31, and 41 that come into contact with the cassette 200, and drive part 22, 32, and 42 that reciprocate the contact parts 21, 31, and 41.

This can implement the cassette clamping parts 20, 30, and 40 that clamp the cassette 200 to the load port adapter 1 in a state where the cassette 200 is positioned at the reference position X of the load port adapter 1.

The cassette clamping parts 20, 30, and 40 are located between the cassette 200 and the holder 10 in a state where the cassette 200 is held on the holder 10.

As a result, since the cassette clamping parts 20, 30, and 40 are hidden between the cassette 200 and the holder 10 in a state where the cassette 200 is held on the holder 10, the cassette clamping parts 20, 30, and 40 can be prevented from being exposed. Thus, the safety in the case of supplying the circuit board using the load port 100 can be further improved.

The load port adapter 1 further includes the frame 50 configured to cover, in a state where the cassette 200 is clamped to the load port 100 and the load port adapter 1, a gap between the supply opening 111 of the load port 100 connected to the opening 200b of the cassette 200 and the outer periphery of the cassette 200 on the opening 200b side.

This can prevent an operator from inserting his or her hand, finger, or the like into the gap between the supply opening 111 of the load port 100 and the cassette 200. Thus, when the cassette 200 is used for the load port 100, safety can be improved.

While at least one embodiment of the present disclosure has been described above, it is merely an example. Thus, the present disclosure is not limited to the at least one embodiment described above, and the at least one embodiment described above may be appropriately modified and implemented without departing from the scope of the present disclosure.

In the at least one above embodiment, the plurality of cassette clamping parts include the first cassette clamping part 20, the second cassette clamping part 30, and the third cassette clamping part 40. However, the plurality of cassette clamping parts may include two cassette clamping parts or may include four or more cassette clamping parts.

Additionally, the direction in which each cassette clamping part clamps the cassette is not limited to the direction described in the above embodiment.

In the at least one above embodiment, the drive parts 22, 32, and 42 of the plurality of cassette clamping parts 20, 30, and 40 reciprocate the contact parts 21, 31, and 41 in different directions. However, the plurality of drive parts may reciprocate at least some of the plurality of contact parts in the same direction. Additionally, the cassette clamping part may clamp the cassette to the load port adapter using a fastening member such as a bolt instead of clamping the cassette to the load port adapter by the drive part pressing the contact part against the protrusion located at the bottom of the cassette. The cassette clamping part may have any configuration as long as the cassette can be clamped in a state of being positioned on the load port adapter.

In the above embodiment, the load port adapter 1 includes the four cassette positioning parts 12. However, the load port adapter may include two or three cassette positioning parts as long as the cassette can be positioned. Additionally, the load port adapter may include five or more cassette positioning parts.

In the above embodiment, the load port adapter 1 includes the frame 50. However, the load port adapter may not include the frame.

The present disclosure is applicable to, for example, a load port adapter fixable on a mounting table of a load port.

Features of the above-described embodiments and the modifications thereof may be combined appropriately as long as no conflict arises.

While embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A load port adapter fixable on a mounting table of a load port, the load port adapter comprising:
    a holder capable of holding a cassette capable of accommodating a plurality of circuit boards,
    wherein the holder includes a position adjustment mechanism configured to position the cassette at a reference position, and is fixable on the mounting table of the load port,
    wherein the position adjustment mechanism includes a plurality of cassette clamping parts configured to clamp the cassette while pressing the cassette toward the reference position
    wherein the plurality of cassette clamping parts include, when the holder is viewed in plan view:
        a first cassette clamping part configured to push the cassette toward the reference position, and
        a third cassette clamping part configured to push the cassette in a direction different from a direction toward the reference position, and
        a force with which the first cassette clamping part pushes the cassette toward the reference position is larger than a force with which the third cassette clamping part pushes the cassette in the direction different from the direction toward the reference position.

2. The load port adapter according to claim 1, wherein each of the plurality of cassette clamping parts includes
    a contact part configured to come into contact with the cassette, and
    a drive part configured to reciprocate the contact part.

3. The load port adapter according to claim 1, wherein each of the plurality of cassette clamping parts is located between the cassette and the holder in a state where the cassette is held on the holder.

4. The load port adapter according to claim 1, further comprising
    a frame configured to cover, in a state where the cassette is clamped to the load port and the load port adapter, a gap between a supply opening of the load port connected to an opening of the cassette and an outer periphery of the cassette on an opening side.

5. The load port adapter according to claim 2, wherein each of the plurality of cassette clamping parts is located between the cassette and the holder in a state where the cassette is held on the holder.

6. The load port adapter according to claim 2, further comprising
    a frame configured to cover, in a state where the cassette is clamped to the load port and the load port adapter, a gap between a supply opening of the load port connected to an opening of the cassette and an outer periphery of the cassette on an opening side.

7. The load port adapter according to claim 3, further comprising
    a frame configured to cover, in a state where the cassette is clamped to the load port and the load port adapter, a gap between a supply opening of the load port connected to an opening of the cassette and an outer periphery of the cassette on an opening side.

8. A load port adapter fixable on a mounting table of a load port, the load port adapter comprising:
    a holder capable of holding a cassette capable of accommodating a plurality of circuit boards,
    wherein the holder includes a position adjustment mechanism configured to position the cassette at a reference position, and is fixable on the mounting table of the load port,
    wherein the position adjustment mechanism includes a plurality of cassette clamping parts configured to clamp the cassette while pressing the cassette toward the reference position
    wherein the plurality of cassette clamping parts include, when the holder is viewed in plan view,
        a first cassette clamping part configured to push the cassette toward the reference position, and
        a third cassette clamping part configured to push the cassette in a direction different from a direction toward the reference position, and
    wherein the first cassette clamping part is bigger than the third cassette clamping part.

* * * * *